(12) United States Patent
Nojo et al.

(10) Patent No.: US 7,316,976 B2
(45) Date of Patent: Jan. 8, 2008

(54) POLISHING METHOD TO REDUCE DISHING OF TUNGSTEN ON A DIELECTRIC

(75) Inventors: Haruki Nojo, Kanagawa (JP); Yoshibumi Suzuki, Kanagawa-Ken (JP)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 0 days.

(21) Appl. No.: 11/132,315

(22) Filed: May 19, 2005

(65) Prior Publication Data

US 2005/0258139 A1    Nov. 24, 2005

Related U.S. Application Data

(60) Provisional application No. 60/572,127, filed on May 19, 2004.

(51) Int. Cl.
*H01L 21/461* (2006.01)
*H01L 21/302* (2006.01)

(52) U.S. Cl. .................. 438/691; 438/692; 438/693
(58) Field of Classification Search .................. None
See application file for complete search history.

(56) References Cited

U.S. PATENT DOCUMENTS

| | | | |
|---|---|---|---|
| 5,733,176 A * | 3/1998 | Robinson et al. ............ 451/41 |
| 5,916,855 A | 6/1999 | Avanzino et al. | |
| 5,928,959 A | 7/1999 | Huckels et al. | |
| 6,062,952 A | 5/2000 | Robinson et al. | |
| 6,099,662 A * | 8/2000 | Wang et al. ............... 134/26 |
| 2001/0018407 A1* | 8/2001 | Kakizawa et al. ......... 510/175 |
| 2002/0125460 A1* | 9/2002 | Tredinnick ............... 252/79.1 |
| 2003/0084815 A1* | 5/2003 | Ohno et al. ............... 106/3 |
| 2005/0155296 A1* | 7/2005 | Siddiqui ................... 51/307 |

OTHER PUBLICATIONS

"Mechanical Removal in CMP of Copper Using Alumina Abrasives" byLirong Guo et al, Jour of Electrochemical Society, 151 (2) G104-G108 (2004).

* cited by examiner

*Primary Examiner*—Duy-Vu N Deo
(74) *Attorney, Agent, or Firm*—Morgan Lewis & Bockius LLP

(57) ABSTRACT

The present invention relates generally to compositions and associated methods for chemical-mechanical polishing of substrate surfaces having at least one feature thereon comprising tungsten and at least one feature thereon comprising a dielectric material. The compositions and associated methods of the invention result in similar removal rates of both the tungsten and the dielectric material. Compositions used in the methods of the present invention typically have a pH from about 1.5 to about 3.5 and comprise periodic acid and colloidal silica.

29 Claims, 2 Drawing Sheets

*Figure 3-a*
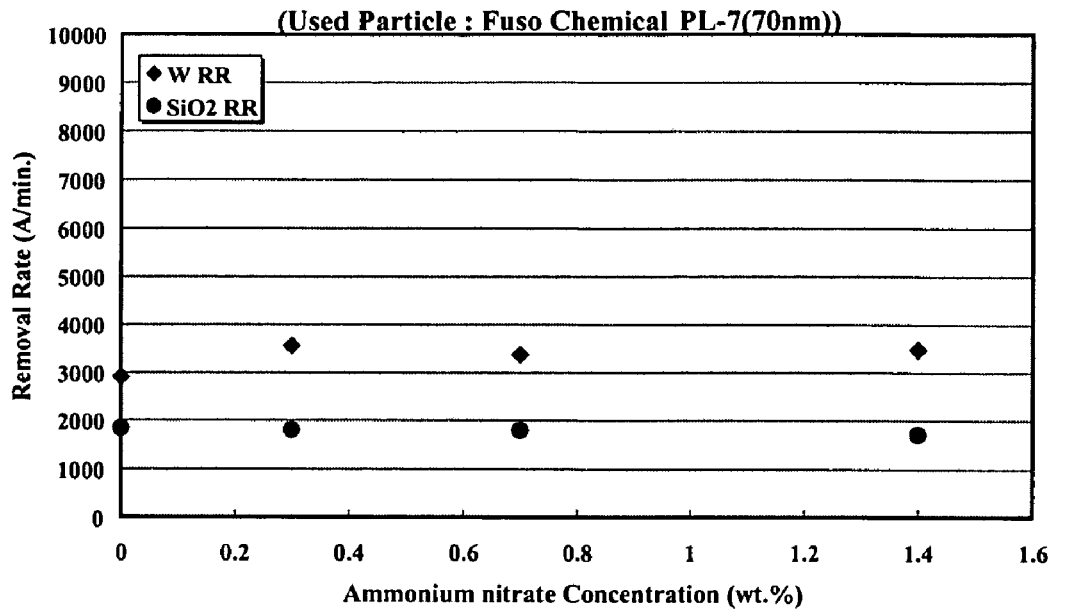
*Figure 3-b*
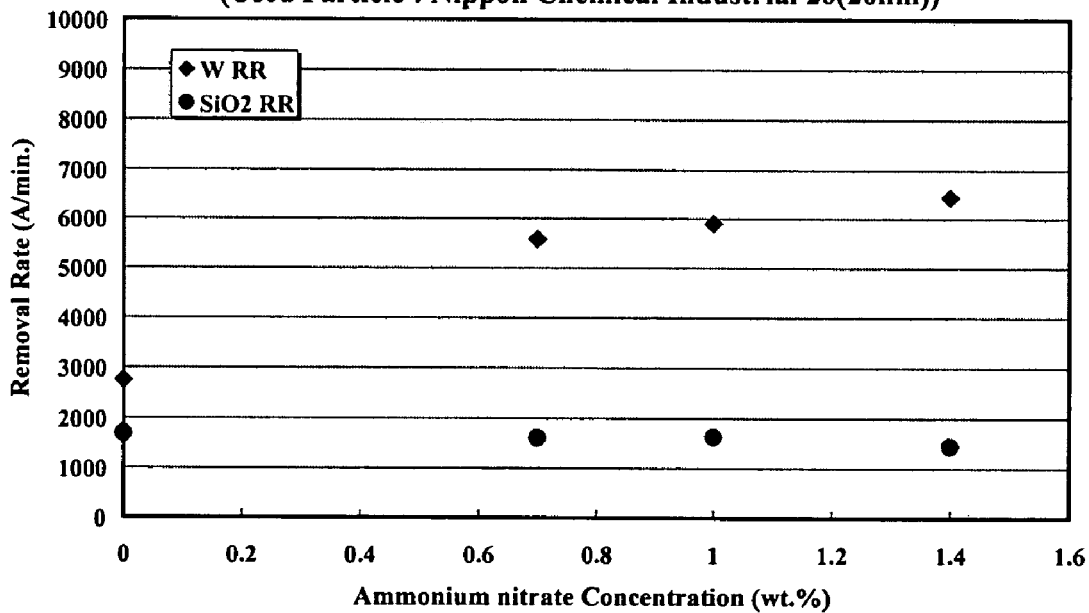

POLISHING METHOD TO REDUCE DISHING OF TUNGSTEN ON A DIELECTRIC

CROSS-REFERENCE TO RELATED APPLICATIONS

This application claims priority to U.S. Provisional Patent Application No. 60/572,127, similarly titled and filed May 19, 2004, and is incorporated herein by reference.

FIELD OF THE INVENTION

The present invention relates generally to methods for chemical-mechanical polishing of substrate surfaces having at least one feature thereon comprising tungsten and at least one feature thereon comprising a dielectric material using aqueous periodic acid polishing formulations.

BACKGROUND OF THE INVENTION

Chemical-Mechanical Planarization, also referred to as Chemical-Mechanical Polishing or simply CMP, is commonly used in the manufacture of semiconductor devices and denotes the process of removing material and forming a substantially planar surface before additional layers are deposited and/or additional patterning of the layers occurs. An accepted method of polishing semiconductor devices involves polishing a surface of the semiconductor with a polishing composition and a polishing pad. In a typical CMP process, a semiconductor wafer is pressed against the polishing pad in the presence of the polishing composition under controlled chemical, pressure, velocity, and temperature conditions. The polishing composition generally contains small, abrasive particles that abrade the surface of the wafer in a mixture with chemicals that oxidize and/or otherwise act upon the newly formed surface of the wafer. A polishing composition that contains abrasives is typically known as a slurry, while a composition that is free from abrasives can be simply termed a solution.

CMP processes have been extensively studied for use in semiconductor fabrication and constitute integral steps in many practical production environments. CMP of metal-containing layers has been studied most extensively in connection with metals such as tungsten, copper, aluminum, tantalum, among others, as well as oxides, nitrides, and alloys thereof. See, e.g., *Chemical Mechanical Planarization of Microelectronic Materials*, by J. M. Steigerwald, S. P. Murarka and R. J. Gutmann (John Wiley & Sons 1997), especially Chapters 5-8. Metals, including tungsten, often compose certain features of a layer in semiconductor fabrication, while other features are composed of a dielectric material.

The polishing of the semiconductor substrate, usually one or more metals over a layer of a dielectric material, uses a CMP slurry comprising abrasives (which may be in the slurry or in the pad), an oxidizer, and one or more additives such as chelators, accelerators, pasivators, and the like. Historically, manufacturers have used formulations that provide very high selectivity between the metal layer and the dielectric material, and formulations that provide very high removal rates. Selectivity is the difference in the rate at which metal is removed compared to the rate at which the dielectric is removed. By high specificity the manufacturers usually require the CMP formulation to, under typical polishing conditions, remove at metal at a rate at least twice as fast, usually at least ten times as fast or more, as the CMP formulation removes the dielectric. Indeed, while selectivity has always been a goal of manufacturers, it is central to U.S. Pat. No. 6,062,952 which claims a process of planarizing a material selected from a group consisting of a dielectric, silicon dioxide, tungsten, polysilicon, aluminum, copper, and $Si_3N_4$; the process comprising polishing a first material at a removal rate equal to X, and continuing polish until there is a second material having a removal rate of not greater than X/4. For tungsten, selectivities are much higher—U.S. Pat. No. 5,916,855 provides an improved slurry having tungsten removal rates near 5000 angstroms per minute and greater selectivity than can be obtained with slurries in the prior art, where "the prior art teaches that tungsten to TEOS polish rate selectivity for CMP is less than 180 . . . (and) that high tungsten/TEOS selectivity requires reduced tungsten polish removal rate." By high rate, the manufacturers usually specify metal removal rates in the range of 3500 to 6000 angstroms of tungsten per minute.

Generally, CMP is performed with a slurry and a pad, where slurry disposed between the downward forcing pad and the substrate aggressively abrades the substrate. The oxidizers react with exposed metal to form metal oxides, which are more readily abraded by the abrasives. Since the pad is presumed to be planar, only the highest portions of the substrate should be polished, until eventually the entire substrate is planarized. A problem with prior art formulations is dishing, a phenomena where depressions are formed in the metal layer that extend below the plane of the surface of the polished substrate. Without being bound by theory, dishing may in part result because the surface to be polished has a topography that includes troughs, and during polishing the polishing slurry enters the troughs in a downward direction, and the abrasive particles contained in the slurry abrade the material in the bottom of the trough, albeit in a lesser amount than the higher points of the topography are abraded, and because the pad is resilient very small, gradual changes in topography will have material be removed rather evenly as opposed to planarizing out this slight defect. Dishing may also be caused or exacerbated by the very aggressive oxidizer chemistries used in modern CMP formulations.

Generally, the art when addressing dishing is concerned with copper substrates, because copper interconnects are typically made using the damascene process. The metal structures in such a copper wafer typically have a larger width than structures made with more conventional metals such as aluminum or tungsten. The damascene structure is a metal-filled trench in existing dielectric layers, and after filling the trench the excess metal is polished off before another dielectric layer is applied. As this is the final step, to prevent shorts caused by residual metal, the surface is generally over-polished to ensure that the only remaining metal is disposed within the trench. However, most metals experience dishing problems, including tungsten, especially if used in a damascene process.

Generally, the art addresses dishing by adding one or more film-forming agents, e.g., benzotriazole or polymeric agents, to the slurry to try to coat and thereby protect the troughs from the aggressive chemistries and from the impinging momentum of the slurry entering troughs in a downward direction. These film-formers, if not removed, can interfere with subsequent processing. Also, some modern low-k dielectrics are damaged by film formers. To ameliorate dishing, some manufacturers apply an excessive amount of tungsten, and thereby incur an increase in polishing time and expense. Other manufacturer are trying to planarize the surface either before polishing by filling inn troughs, or very early in the polishing process by not using oxidizers, to eliminate troughs. Yet other manufacturers are reducing dishing by placing a sacrificial dielectric layer disposed above a first dielectric, where the sacrificial dielectric layer is eventually removed by polishing, as described in U.S. Pat. No. 5,928,959.

CMP of tungsten over dielectric semiconductor surfaces encounters dishing problems. It is the object of the present invention to reduce dishing of tungsten features over a dielectric.

SUMMARY OF THE INVENTION

The present invention is directed to CMP methods for reducing removal selectivity between tungsten and a dielectric, and thus reducing the dishing of tungsten. The method includes the steps of 1) providing a substrate having a surface comprising tungsten metal or alloy disposed over a dielectric material; 2) introducing a polishing slurry of this invention to the surface of the substrate; 3) movably applying a pad over the polishing slurry-covered substrate until reaching an end-point, thereby removing tungsten and during later portions of polishing removing both tungsten and dielectric material; and 4) cleaning and rinsing the polishing slurry from the substrate. Beneficially the dielectric material comprises one or more of PSG, TEOS, Thermal oxide, NSG, and HDP.

The polishing slurry used in the methods of the invention is an aqueous slurry that, based on the weight of the slurry, comprise, consist essentially, or consist of:

A) about 87.2% to 99.45%, preferably about 91.4% to about 98.9%, for example about 93.5% to about 96.75%, water;

B) about 0.05% to about 0.8%, preferably about 0.1% to about 0.6%, for example between about 0.25% to about 0.5%, periodic acid; and C) about 0.5% to about 12%, preferably about 1% to about 8%, for example about 3% to about 6%, of a silica abrasive, wherein the abrasive has a weight-average mean particle diameter between about 15 to about 120 nanometers, preferably between about 25 to about 90 nanometers, for example between about 50 and about 90 nanometers, and wherein the abrasive is preferably colloidal silica, and further wherein the silica is beneficially cocoon-shaped, wherein the aqueous slurry has a pH of about 1.5 to about 3.5, preferably about 1.7 to about 3, more preferably 1.8 to 2.5. In some embodiments, the particles have an average particle diameter of between about 10 nm and about 100 nm, preferably between about 15 and about 80 nm, for example between about 20 nm and about 70 nm. Alternately, in other preferred embodiments, the abrasive has an average particle diameter between about 20 to about 120 nanometers, preferably between about 30 to 100 nanometers, for example between 50 and 90 nanometers.

In an alternate embodiment, the polishing pad may be abrasive, for example by having thereon bound colloidal silica, and the compositions used in the methods of the invention are then aqueous compositions having a pH of about 1.5 to about 3.5, preferably about 1.7 to about 3, and comprise, consist essentially, or consist of:

A) about 91.2% to about 99.95% water;

B) about 0.05% to about 0.8%, preferably about 0.1% to about 0.6%, for example between about 0.25% to about 0.5%, periodic acid; and C) about 0% to about 8%, for example about 0.2% to about 5%, of a silica abrasive, based on the weight of the aqueous composition.

The removal rate of tungsten depends primarily of polishing conditions, but typically ranges from 300 to about 6000 Angstroms per minute (Å/min); preferably from 1000 to 5000 Å/min, for example from 1500 to 2500 Å/min. The absolute rate can be made to vary over wide ranges simply by adjusting polishing conditions, but rates over 1000 Å/min are generally beneficial from a commercial view. The more important criteria is the selectivity (ratio of removal rates) between tungsten and the dielectric. The ratio of the rate at which tungsten is removed compared to the rate at which the dielectric is removed, for a given polishing condition providing tungsten removal rates within the above-stated range, may be from about 1:2 to about 2:1, preferably from about 1:1.7 to about 1.7:1. Beneficially, the ratio of the removal rate of tungsten to the removal rate of the dielectric, at a top ring pressure of about 41000 Pa as shown in Table 1, is between 2:1 to about 1:1, preferably between 1.7:1 to 1:1, for example from 1.5:1 to 1:1. Beneficially, the ratio of the removal rate of tungsten to the removal rate of the dielectric is between about 1.3:1 to about 1:1.3, preferably from about 1:1.15 to about 1.15:1, more preferably from about 1:1.05 to about 1.05:1.

BRIEF DESCRIPTION OF THE DRAWINGS

The following drawings are illustrative of embodiments of the invention and are not meant to limit the scope of the invention encompassed by the claims;

FIG. 3a, b are graphs showing the removal rate of tungsten and silica as a function of ammonium nitrate concentration.

DETAILED DESCRIPTION OF THE PREFERRED EMBODIMENTS

Figure 1:
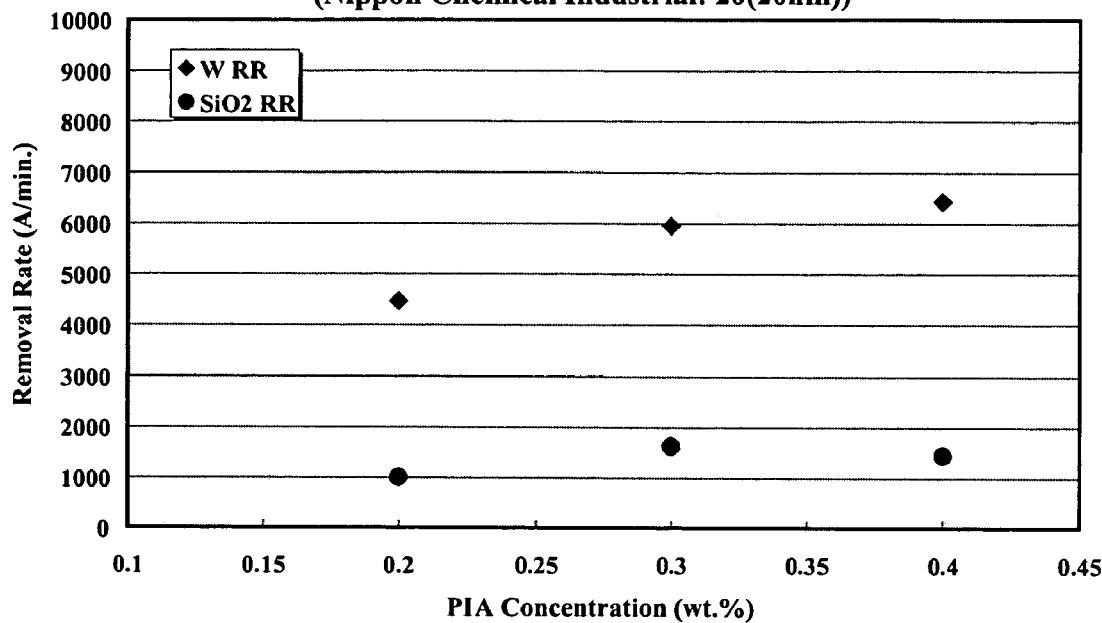
FIG. 1 is a graph showing the removal rate of tungsten and silica as a function of periodic acid (PIA) concentration.

As used herein, the term "substantially free of" in relation to a compound is generally defined by numerical limits. The term "substantially free of" also includes the embodiment wherein the amount of the compound is such that the effect of the compound is negligible, and also the embodiment where the composition is completely free of the compound. As used herein, unless otherwise stated, percents are always percent by weight based on the total weight of the composition, e.g., polishing slurry, polishing composition, rinsing composition, and the like.

As stated above, the method includes the steps of 1) providing a substrate having a surface comprising tungsten metal or alloy disposed over a dielectric material; 2) introducing a polishing slurry of this invention to the surface of the substrate; 3) movably applying a pad over the polishing slurry-covered substrate until reaching an end-point, thereby removing tungsten and during later portions of polishing removing both tungsten and dielectric material; and 4) cleaning and rinsing the polishing slurry from the substrate.

The present invention is particularly suitable for polishing very high density semiconductor substrates, although it is equally useful for memory devices, memory disks, optical instruments, nanotechnology machines, and the like, where smooth surfaces are desired on substrates that contain features on the order of tenths of nanometers to several microns in size. The method according to the invention is particularly useful for substrates that comprise, consist essentially of, or consist of tungsten metal and a low-k dielectric material. The tungsten can be in the form of pure metal, or be alloyed with one or more metals, e.g., Ti, Ta, Al, Cu, and the like, and/or be in the form of a nitride or carbide. The substrate can further comprise any other suitable metals, metal oxide, or other metal compound such as nitride or carbide, as well as any metal composite, dielectric, ferroelectric materials, (co)polymeric material, organometallic material, silica, phosphosilicate glass (PSG), tetraethoxysilane (TEOS), thermal oxide, nanoporous silica glass (NSG), or HDP. Beneficially the dielectric material comprises one or more of PSG, TEOS, Thermal oxide, NSG, and HDP.

The compositions and processes of the present invention are suitable for use in applications such as the polishing of tungsten over a dielectric substrate, or less typically for a dielectric layer over tungsten substrate, at desirable polishing rates using standard CMP equipment. As used herein, the chemical-mechanical polishing of a substrate having a metal feature or layer on its surface should be understood to refer to the polishing of the substrate surface until the only remaining metal on the surface is the desired metal features, and the surface is substantially coplanar with surrounding material including the dielectric material on the substrate. By way of example, suitable surface planarization is reflected by wafer-within-wafer non-uniformity values of less than about 12%, for example less than about 6%, and wafer-to-wafer non-uniformity values of less than about 5%, for example less than about 3%, as measured using known wafer profiling techniques.

The polishing slurry used in the methods of the invention are aqueous slurries that, based on the weight of the slurry, comprise, consist essentially, or consist of:
A) about 87.2% to 99.45%, preferably about 91.4% to about 98.9%, for example about 93.5% to about 96.75%, water;
B) about 0.05% to about 0.8%, preferably about 0.1% to about 0.6%, for example between about 0.25% to about 0.5%, periodic acid; and
C) about 0.5% to about 12%, preferably about 1% to about 8%, for example about 3% to about 6%, of a silica abrasive, wherein the abrasive has a weight-average mean particle diameter between about 15 to about 120 nanometers, preferably between about 25 to about 90 nanometers, for example between about 50 and about 90 nanometers, and wherein the abrasive is preferably colloidal silica, and further wherein the silica is beneficially cocoon-shaped;
wherein the composition has a pH of about 1.5 to about 3.5, preferably about 1.7 to about 3, more preferably 1.8 to 2.5.

In an alternate embodiment, the polishing pad may be abrasive, for example by having thereon bound colloidal silica, and the compositions used in the methods of the invention are then aqueous compositions having a pH of about 1.5 to about 3.5, preferably about 1.7 to about 3, and comprise, consist essentially, or consist of:
A) about 91.2% to about 99.95% water;
B) about 0.05% to about 0.8%, preferably about 0.1% to about 0.6%, for example between about 0.25% to about 0.5%, periodic acid; and
C) about 0% to about 8%, for example about 0.2% to about 5%, of a silica abrasive, based on the weight of the aqueous composition.

The polishing slurry used in the methods of the invention are aqueous slurries that, based on the weight of the slurry generally contain_A) about 87.2% to 99.45%, preferably about 91.4% to about 98.9%, for example about 93.5% to about 96.75%, water. That is, the polishing slurry in preferred embodiments is deionized water, ultrapure water, electronic-grade water, or the like, where the amount of dissolved metals or metal ions that can contaminate a substrate contained within the solvent are present in an amount typically less than 20 ppm. The purer the water, the less need for chelators to prevent contamination of the substrate.

In alternate embodiments some or all of the water could be replaced by one or more polar organic solvents having capacity to solvate the polished ions, including for example alkanolamines and amides. Generally water is preferred both from a cost standpoint and from a environmental standpoint, but some newly-developed low-k substrates show increasing sensitivity to water.

The polishing slurry used in the methods of the invention are aqueous slurries that, based on the weight of the slurry generally contain_B) about 0.05% to about 0.8%, preferably about 0.1% to about 0.6%, for example between about 0.25% to about 0.5%, periodic acid. This is a low amount of oxidizer. FIG. 1 shows that the removal rate of tungsten is highly dependent on the quantity of periodic acid, while the removal rate of the dielectric is substantially independent of the quantity of periodic acid. This data was obtained using a slurry having 1.4% ammonium nitrate and 4.7% of 20 nanometer silica (available from Nippon Chemical Industrial, JP). While the graph suggests that the lower the periodic acid content the closer to unity is the selectivity of tungsten to the dielectric. However, at very low concentrations of periodic acid, for example less than 0.5%, the change in concentration during polishing due to consumption of periodic acid can result in uneven polishing. Further, at very low concentrations, small variations due to material aging and/or to errors in preparation can have a large effect on slurry performance. Therefore, as a practical matter the lower limit of periodic acid is 0.05%, and the preferred lower limit is 0.1, and the commercial embodiments have a lower limit of about 0.25% periodic acid. On the other hand, to much periodic acid will result in to great a tungsten polishing rate. For example, at 1% periodic acid, it was difficult to control the tungsten rate to any value the slurry could be expected to reach for removing the dielectric.

Preferably the composition is substantially free of other oxidizers, including persulfates, peroxides, peracetic acid, ferric salts, and the like. By substantially free of other oxidizers we mean less than 0.1%, preferably less than 0.05%, and typically less than 0.01% by weight of other oxidizers. In one embodiment of the invention, the composition may comprise a small quantity, for example between about 3 ppm and about 500 ppm, of iron ions absorbed onto the silica. These iron ions are not oxidizers, but rather they induce formation of free radicals in the periodic acid, and these free radicals can greatly increase the removal rate of both the metals and of the dielectric.

In preferred embodiments the CMP slurries according to the present invention comprise an abrasive. While it is recognized that the abrasive can be affixed to a polishing pad, this is often undesirable, because uneven wear may result in areas of the pad having a deficiency of abrasive. The preferred compositions according to the invention comprise an abrasive suspended in a slurry. The polishing slurry used in the methods of the invention are aqueous slurries that, based on the weight of the slurry generally contain_C) about 0.5% to about 12%, preferably about 1% to about 8%, for example about 3% to about 6%, of a silica abrasive. Generally, the amount of silica is not important within the cited range, and an amount between 4% and 5% is typically used for evaluation. The amount of abrasive, e.g., silica, can be decreased or even eliminated if the polishing pad comprises abrasives thereon, for example to about 0% to about 8%, alternately about 0.2% to about 5%, based on the weight of the aqueous composition.

In one embodiment, the abrasive comprises silica. In another embodiment, the abrasive comprises colloidal silica. In preferred embodiments, the abrasive is silica, more particularly colloidal silica. An important criteria is that the product have very low number of defects, particularly larger defects, for example less than 50 defects greater than 0.15 micrometer as measured with a KLA-Tencor SP-1. Abrasives other than colloidal silica, such as alumina and even filmed silica, were too abrasive and would provide to many defects.

The percentage values used herein to describe the nature of the abrasive particles in terms of particle size are percentages "by number," rather than being weight percentages, unless otherwise noted. The particle size of the abrasive particles refers to the particle diameter. The particle size can be measured by any suitable technique. The particle size values set forth herein are based on a visual inspection, specifically by way of transmission electron micrography (TEM), of a statistically significant sample of the abrasive particles, preferably at least 200 particles. When size ranges are specified, e.g., from about 10 to about 80 nanometers, the average particle size falls within those extremes, but some of the particles in the size distribution will not. Preferably, the individual particles have a sufficiently narrow size distribution such that substantially all particles, i.e., at least 95% by count (for a monomodal size distribution) have sizes within about 30%, in some cases within about 10%, of the average particle diameter. In the case of a slurry with a particle size of between about 10 and about 80 nanometers, for example, a preferred composition may have an average particle size of about 20 nanometers, and thus at least 95% of particles have sizes between about 14 and about 26 nanometers, in some cases between about 18 and about 22 nanometers. Generally, while it is known to use bimodal and tri-modal distributions of particle sizes, in preferred embodiments of the invention, the particles have a substantially monomodal particle size distribution. One preferred composition has abrasive particles which are substantially monomodal and are of an average diameter between about 20 and about 70 nanometers. In other compositions of the invention, the abrasive particles mentioned herein can have particle size distributions that are bimodal or trimodal.

Generally, less defects are obtained as smaller, rounder, and more uniformly sized abrasive particles are used. In preferred preparations, the particles have an average particle diameter of between about 10 nm and about 100 nm, preferably between about 15 and about 80 nm, for example between about 20 nm and about 70 nm. Alternately, in other preferred preparations, the abrasive may have an average particle diameter between about 20 to about 120 nanometers, preferably between about 30 to 100 nanometers, for example between 50 and 90 nanometers.

Figure 2:
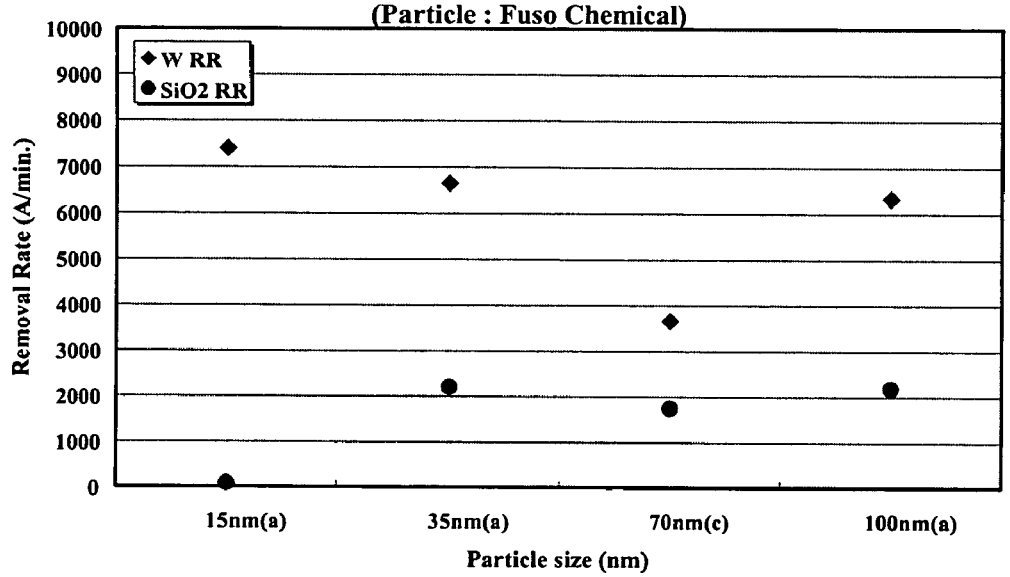
FIG. 2 is a graph showing the removal rate of tungsten and silica as a function of colloidal silica particle size.

FIG. 2 shows the relationship between mean particle size and the removal rates of tungsten and of the dielectric. The silicas used were highly uniform, highly spherical or cocoon-shaped colloidal silicas (available from Fuso Chemical, JP). The silicas having diameter of 15 nanometers, 35 nanometers, and 100 nanometers were highly spherical, e.g., the diameter measured in one direction is within about 10% of the diameter measured in any other direction. The test data showed that very small 15 nm smooth round Fuso silica particles could not remove dielectric, but the small particles (which are present in a much larger number per unit volume than larger particles) could readily abrade the oxidized tungsten. For this reason the very small particles, e.g., less than 15 nanometers (aggregates size), are not preferred, even though they typically provide lower numbers of large defects, if the silica particles are very smooth and round.

Silica from Fuso Chemical of Osaka, Japan may not be equivalent to silica from Nippon Chemical of Tokyo, Japan, though both have excellent qualities for a variety of polishing uses. Silica of 20 nm average diameter from Nippon Chemical appears more abrasive than the Fuso silica. Tests using 20 nm silica from Nippon Chemical Industrial showed dielectric polishing rates of 1500 to 1800 angstroms per minute in similar tests, which is well above the 85 angstrom per minute rate from Fuso 15 nm silica and near the 2200 angstrom per minute rate from Fuso 35 nm silica. The difference between dielectric polishing rates is apparently very dependent on particle size and morphology, but the critical size seems to be around 15 nm.

In a preferred embodiment of the invention, the colloidal silica particles are the PL-7™ high purity, substantially cocoon-shaped, colloidal silica particles manufactured by Fuso Chemical, which have an average particle size of about 70 nm. In another preferred embodiment, the colloidal silica particles are colloidal silica particles commercially available from Nippon Chemical having an average particle size of about 20 nm.

The abrasive particles typically form aggregates, which are particles loosely or strongly held together in clumps, where the number of particles in an aggregate depends largely on the chemistry of the composition and on the particle size. Aggregates have substantially the same dimensions, plus or minus about 70%, measured in each direction, and have a plurality of particles interconnected such that a plurality of particles contact at least three other particles. Such aggregates can be desirable because they have high polishing rates similar to those found with bigger particles, but also have some resiliency, which reduces gouging.

A surprising feature of FIG. 2 is the substantial effect of using a cocoon-shaped abrasive had on the tungsten polishing rate. The cocoon-shaped abrasive seemed to reduce dielectric polishing by about 15%, but the tungsten removal rate was reduced about 40%. As the tungsten removal rate is always above the dielectric removal rate for this chemistry, the reduction gave a significant lowering of the selectivity towards unity. Cocoon-shaped abrasive is generally defined in the industry as a particle where the length component is a factor of two or three times the width component. While it is possible to form cocoon-shaped particles of a single matrix, the cocoon-shaped particles may comprise from 2 to 5 loosely bound smaller particles that form a chain. One preferred composition has abrasive particles that are cocoon-shaped where 2 to 4 individual particles forming the cocoon are of an average size of between about 20 and about 100 nanometers, for example between about 35 and about 90 nanometers.

It is realized that formulations may and usually do contain a plurality of structures, be they monodispersed particles, cocoon shaped particles, cocoon-shaped particles formed of bound substantially spherical particles, chains, and aggregates. As used herein, when a structure is specified, at least about 50% of the weight of abrasive should have that structure at least before polishing. When two or more structures are specified, at least about 70% of the particles by weight should fall into the categories mentions, at least before polishing.

The polishing slurry used in the methods of the invention are aqueous slurries that have a pH of about 1.5 to about 3.5, preferably about 1.7 to about 3, more preferably 1.8 to 2.5. Very low concentrations of periodic acid can have higher pHs, but the pH may change during polishing. Generally, compositions buffered to higher pH values, e.g., nearer to pH 4 to 9, are desirable for handling. The buffering salt of choice to give a higher pH composition was ammonium nitrate. Surprisingly, the test data, shown in FIGS. 3a and 3b, showed that for both the Nippon 20 nm silica and for the Fuso 70 nm cocoon-shaped silica, the polishing rates of the dielectric were closest to the polishing rates of the tungsten when no ammonium nitrate was in solution. For this reason, the polishing compositions of this invention are preferably substantially free of added bases. By substantially free we mean generally less than 0.4%, preferably less than 0.2%, for example less than 0.1% or completely free of a basic amine including ammonia and ammonium salts. Additionally, the slurry having the 20 nm Nippon silica was much more effected by the ammonium nitrate, having a selectivity of 1.6 at 0% ammonium nitrate to 4.4 at 1.4% ammonium nitrate, while the slurry having the Fuso 70 nm cocoon-shaped silica selectivity varied from 1.6 at 0% ammonium nitrate to 2.0 at 1.4% ammonium nitrate.

The removal rate of tungsten depends primarily of polishing conditions, but typically ranges from 300 to about 6000 Angstroms per minute (Å/min); preferably from 1000 to 5000 Å/min, for example from 1500 to 2500 Å/min. The absolute rate can be made to vary over wide ranges simply by adjusting polishing conditions, but rates over 1000 Å/min are generally beneficial from a commercial view. The more important criteria is the selectivity (ratio of removal rates) between tungsten and the dielectric. The ratio of the rate at which tungsten is removed compared to the rate at which the dielectric is removed, for a given polishing condition providing tungsten removal rates within the above-stated range, may be from about 1:2 to about 2:1, preferably from about 1:1.7 to about 1.7:1. Beneficially, the ratio of the removal rate of tungsten to the removal rate of the dielectric, at a top ring pressure of about 41000 Pa as shown in Table 1, is between 2:1 to about 1:1, preferably between 1.7:1 to 1:1, for example from 1.3:1 to 1:1.

Generally, substrate and pad rotational speed is between 20 and 140 revolutions per minute, pressure on the top ring is between 5000 and 70000 Pa, and the slurry rate is between about 60 and about 500 cc per minute. Typical polishing parameters one could use with the slurries of this invention are shown in Table 1. We described above formulations that could provide selectivity (tungsten to dielectric) that is below about 2. The above removal rates and selectivities were measured at a top ring pressure of about 41000 Pa. We found that decreasing the top ring pressure (pressure between the pad and the substrate) would result in decreasing rate but also in even further decreases in selectivity.

At 41000 Pa, the formulation with the 70 nm cocoon-shaped silica particles had a tungsten removal rate of 2900 angstroms per minute and a tungsten/dielectric selectivity of 1.6:1. Decreasing the top ring pressure to 15000 Pa decreased the tungsten polishing rate to 500 angstroms per minute and the tungsten/dielectric selectivity to 0.8:1. It can be seen that at a pressure between 15000 Pa and 41000 Pa the selectivity was unity.

At 41000 Pa, the formulation with the 20 nm Nippon silica had a tungsten removal rate of 2750 angstroms per minute and a tungsten/dielectric selectivity of 1.6:1. Decreasing the top ring pressure to 15000 Pa decreased the tungsten polishing rate to 1100 angstroms per minute and the tungsten/dielectric selectivity to 1.5:1. Since the Nippon spherical 20 nm particles are both more affected by buffers and do not show strong reductions in the selectivity toward unity as the top ring pressure is reduced, these abrasive particles are less preferred than the 70 nm cocoon-shaped silica particles.

As a practical improvement to the polishing process, the top ring pressure can be kept high, e.g., between about 30000 and 70000 Pa, during initial polishing so that the excess tungsten can be readily removed. Then, as the polishing nears the dielectric layer, the top ring pressure can be reduced to a lower value, e.g., between 5000 and 25000 Pa and the substrate can be further polished to the end-point.

Any suitable polishing pad (e.g., polishing surface) can be used in conjunction with the inventive polishing method. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, and co-formed products thereof, and mixtures thereof. As discussed above, the abrasive can be fixed (e.g., embedded), in whole or in part, in or on the polishing pad. In such case, the abrasives may be somewhat larger than those specified for slurries. Such fixation on the polishing pad can be accomplished, for example, by blending the abrasive into the aforementioned polymers during the formation of the polishing pad or by adhering the abrasive to the pad after the pad is formed using such adherents as are known. In one embodiment, the polishing surface of the polishing pad further comprises a multiplicity of cavities which are thought to provide channels through which the polishing slurry can flow. Cavities includes recesses or indentations in the surface of the pad, protrusions arranged in such fashion as to form recesses between the protruding portions of the surface of the pad, or any combination of recesses and protrusions.

The compositions used in the methods of the invention can further comprise additional additives, including, but not limited to, buffering salts that are substantially free of metals or metal ions that can contaminate a substrate, chelators, suspension agents, corrosion inhibitors, chelators, metal-based accelerators, non-metal-based accelerators, rheological agents, additional oxidizers, and abrasive treatment components.

In many preferred embodiments of this invention, additional additives are not desired. However, additives can be added to the slurry (or liquid polishing composition). It is known that tungsten solubility is very low, and chelators can help prevent tungsten deposition onto the substrate. However, since the polishing rate of tungsten is low near the end-point (if the top ring pressure is reduced as discussed infra), the slurry will likely not need a chelator. Since dielectric layer is being polished away, any contamination from for example tungsten plating out due to higher tungsten concentrations at higher polishing rates will be removed along with the dielectric. Therefore, in one embodiment, the slurry composition comprises a chelator, for example a dicarboxylic acid, tricarboxylic acid, EDTA, and/or other common chelating agents, for example in a concentration from about 0.1% to about 2% or from about 0.1% to about 0.5%, to chelate tungsten. However, in a preferred embodiment, the slurry can be substantially free, e.g., less than 0.2%, preferably less than 0.1%, of chelators.

In one embodiment, a buffering compound such as ammonium nitrate, ammonia, TMAH, or the like is included, e.g., for example in a concentration from about 0.01% to about 1% or from about 0.1% to about 0.4%, to help buffer the composition to a higher pH. Beneficially, if a buffer is included, the abrasive is a cocoon-shaped abrasive, and the size of the abrasive is at least 30 nm. However, in a preferred embodiment, the slurry can be substantially free, e.g., less than 0.2%, preferably less than 0.1%, from buffering salts (that are substantially free of metals or metal ions that can contaminate a substrate) such as ammonium nitrate.

In a preferred embodiment, the slurry can be substantially free, e.g., less than 0.2%, preferably less than 0.1%, of suspension agents. In a preferred embodiment, the slurry can be substantially free, e.g., less than 0.2%, preferably less than 0.1%, of corrosion inhibitors. In a preferred embodiment, the slurry can be substantially free, e.g., less than 0.1%, preferably less than 0.01%, of metal-based accelerators and non-metal-based accelerators. In a preferred embodiment, the slurry can be substantially free, e.g., less than 0.2%, preferably less than 0.1%, of rheological agents. In a preferred embodiment, the slurry can be substantially free, e.g., less than 0.5%, preferably less than 0.2%, of additional abrasive treatment components.

The present invention is directed to CMP methods for reducing removal selectivity between tungsten and a dielectric, and thus reducing the dishing of tungsten. The method includes the steps of 1) providing a substrate having a surface comprising tungsten metal or alloy disposed over a dielectric material; 2) introducing a polishing slurry of this invention to the surface of the substrate; 3) movably applying a pad over the polishing slurry-covered substrate until reaching an end-point, thereby removing tungsten and during later portions of polishing removing both tungsten and dielectric material; and 4) cleaning and rinsing the polishing slurry from the substrate. Generally, substrate and pad rotational speed is between 20 and 140 revolutions per minute, pressure on the top ring is between 5000 and 70000 Pa, and the slurry rate is between about 60 and about 500 cc per minute. Typical polishing parameters one could use with the slurries of this invention are shown in Table 1. We found that decreasing the top ring pressure (pressure between the pad and the substrate) would result in decreasing rate but also in even further decreases in selectivity.

Another general method of polishing is to provide the composition or slurry in an amount typically between about 20 ml/min to 250 ml/min to a volume between a substrate and a polishing pad, with a small amount of pressure such as between 2 and 12 psi, at a temperature between about ambient and about 70 C, where the pad is moved relative to the substrate, for example by rotating the pad and/or rotating a platen on which the substrate is mounted, for example between about 10 and about 200 rpm for either or both. Use of the compositions and processes of the present invention may reduce, minimize or eliminate imperfections, defects, corrosion, recession and/or erosion that might otherwise appear on the substrate surfaces. The polishing composition is then rinsed from the substrate.

The method of the invention always requires cleaning and rinsing the polishing slurry from the substrate. The typical prior art rinse is water. We have found that, especially with polishing slurries not containing a chelator, that the polished substrate surface can beneficially be cleaned with a formulation comprising A) between 0.5 and 2 parts, for example about 1 part, by weight of ammonium hydroxide, an ammonium salt such as ammonium nitrate, and/or an alkyl amine (e.g., having less than about 6 carbon atoms); B) between 0.5 parts and 4 parts, for example about 2 parts, of hydrogen peroxide or urea hydrogen peroxide, and C) between about 4 parts to about 15 parts, for example between 7 and 10 parts, of water.

Alternately or additionally, the composition can be cleaned with an aqueous formulation comprising an organophosphonate acid compound, e.g., about 0.1% to about 2% of amino tris methylenephosphonic acid, a ethylenediamine tetra methylenephosphonic acid, a hexamethylenediamine tetra methylenephosphonic acid, a diethylenetriamine penta methylenephosphonic acid, and a 1-Hydroxy ethane diphosphonic acid.

Such rinses have been found to remove trace metal contamination. The first rinse is generally effective, and the second rinse is particularly useful to remove iron.

EXAMPLES

Many of the example were discussed above in relation to FIGS. 1, 2, and 3a-b in the sections above. FIG. 1 is a graph showing the removal rate of tungsten and of dielectric material as a function of PIA concentration. Polishing conditions were as shown in Table 1. The particle size of colloidal silica in the compositions used in this test was 20 nm, and each example contained about 4.7 weight percent silica. The PIA concentration was varied from about 0.1 weight percent to about 0.4 weight percent, and results showed increasing tungsten removal rates with increasing periodic acid content.

FIG. 2 is a graph showing the removal rate of tungsten and of dielectric material as a function of colloidal silica particle size. Polishing conditions were as shown in Table 1. The PIA concentration in these tests was a constant 0.4 weight percent. The concentration of colloidal silica was 3.7 weight percent in the first run, but 4.7 weight percent in the remaining runs. The colloidal silica particle size used in the successive runs was 15 nm spherical silica (the run in which the concentration of colloidal silica was 3.7 weight percent), 35 nm spherical silica, 70 nm cocoon-shaped silica, and 100 nm spherical silica. The lowest tungsten removal rate, and the example with the selectivity closest to unity at a top ring pressure of 41000 Pa, was the slurry with 70 nm cocoon-shaped silica.

FIGS. 3a and 3b showed tests where a slurry having 4.7% silica (70 nm cocoon-shaped silica in 3a and 20 nm silica in 3b), 0.4% periodic acid, water, and varying amounts of ammonium nitrate. Polishing conditions were as shown in Table 1. The examples with the selectivity closest to unity at a top ring pressure of 41000 Pa was the slurries with no added ammonium nitrate.

The concentration of defects and the presence of defects of critical size (e.g., greater than about 0.15 microns) present after polishing can be considered a measure of the polishing effectiveness. It is preferable that the concentration of critical size defects on the polished substrate be as low as possible, with a maximum acceptable level being, e.g., less than about 100 critical size defects per substrate, preferably not more than about 75 critical size defects per substrate or not more than about 60 critical size defects per substrate.

Defect data was found to vary with the polishing pressure. Defect data (obtained from a KLA-Tencor SP-1) for samples polished at the conditions shown in Table 1 with the formulations containing 4.7% silica, 0.4% periodic acid, and water, and then were cleaned with water, are shown in Table 2. When polishing under a relatively high polish pressure (about 410 hPa), a composition using the Nippon Chemical colloidal silica abrasive exhibited about 85 critical size defects per substrate (extrapolated), while a composition using the Fuso Chemical colloidal silica abrasive exhibited about 140 critical size defects per substrate (extrapolated). However, when the polishing pressure (top ring pressure) was reduced about 60-65% (to about 150 hPa), the compositions fared much better: The composition using the Nippon Chemical colloidal silica abrasive exhibited about 60 critical size defects per substrate (extrapolated), while the composition using the Fuso Chemical colloidal silica abrasive exhibited about 57 critical size defects per substrate (extrapolated). This data is presented in Table 3.

Samples polished with a composition containing 4.7% of 70 nm cocoon-shaped silica, 0.4% periodic acid, and water were rinsed with a first rinse having 1 part ammonium hydroxide, 2 parts hydrogen peroxide, and 10 parts water (Chemical clean 1), or was rinsed in a water/organophosphonate composition (chemical clean 2), or was rinsed in deionized water. The substrate was then tested for metal contaminants, and the data is shown in Table 4. The contaminants found were all within the acceptable ranges.

Those skilled in the art will appreciate that, given the present disclosure, modifications may be made to the invention without departing from the spirit of the inventive concept described herein. Therefore, it is not intended that the scope of the invention be limited to the specific embodiments illustrated and described herein.

TABLE 1

| W-CMP | Step 1 | Water | Clean | Dress |
|---|---|---|---|---|
| Process [sec] | 60 | 20 | 10 | 15 |
| T.T. Rotation [min − 1] | 100 | 20 | | 40 |
| T.R. Rotation [min − 1] | 107 | 25 | | |
| T.R. Pressure [Pa × 100] | 410 | 100 | | |
| T.R. Oscillation [mm] | 0 | 0 | | |
| T.R. Oscill. Speed [mm/s] | 20 | 20 | | |
| Polishing Select | 00:Free | 01:Vac | | |
| Back Side Pressure [Pa × 100] | 50 | 100 | | |
| Guide Ring Pressure [Pa × 100] | 250 | 250 | | |
| D.R. Select | 00:No | | | 01:Head |
| D.R. Rotation [min − 1] | 10 | | | 17 |
| D.R. Load [N] | 200 | | | 250 |
| D.R. Oscillation [mm] | 0 | | | 0 |
| D.R. Oscillation Speed [mm/sec] | 20 | | | 20 |
| Slurry Select | 01:LineA | 00:D.I. | | 00:D.I. |
| Slurry Rate LineA [cm3/min] | 200 | 20 | | 200 |
| Slurry Rate LineB [cm3/min] | 200 | 200 | | 200 |
| End Point Select | | | | |
| End Point Recipe No. | | | | |

TABLE 2

| | Chemical Formulation No. | | | |
|---|---|---|---|---|
| | YSX-001 (Nippon Chemical) | | YSX-002 (Fuso Chemical) | |
| Particle Size | Initial | Actual | Initial | Actual |
| >0.100 nm | 8 | 174 | 7 | 388 |
| >0.120 nm | 8 | 136 | 6 | 260 |
| >0.140 nm | 8 | 99 | 6 | 166 |
| >0.170 nm | 6 | 57 | 4 | 90 |
| >0.200 nm | 5 | 33 | 4 | 48 |
| >0.300 nm | 5 | 13 | 4 | 14 |
| >0.500 nm | 4 | 5 | 4 | 5 |

TABLE 3

| | Chemical Formulation No. | | | |
|---|---|---|---|---|
| | YSX-001 (Nippon Chemical) | | YSX-002 (Fuso Chemical) | |
| Particle Size | DIW Cleaning | Chemical Cleaning | DIW Cleaning | Chemical Cleaning |
| 0.100 nm up | 174 | 324 | 388 | 187 |
| 0.120 nm up | 136 | 179 | 260 | 140 |
| 0.140 nm up | 99 | 74 | 166 | 93 |
| 0.170 nm up | 57 | 36 | 90 | 66 |
| 0.200 nm up | 33 | 28 | 48 | 49 |
| 0.300 nm up | 13 | 4 | 14 | 21 |
| 0.500 nm up | 5 | 1 | 5 | 12 |

TABLE 4

| | Position | | Ti | Cr | Mn | Fe | Co | Ni | Cu | Zn |
|---|---|---|---|---|---|---|---|---|---|---|
| | x (mm) | y (mm) | E10A/cm2 | E10A/cm2 | E10A/cm2 | E10A/cm2 | E10A/cm2 | E10A/cm2 | E10A/cm2 | E10A/cm2 |
| Chemical Clean #1 | 0 | 0 | ND | ND | 0.44 | ND | ND | 0.23 | ND | 0.3 |
| | 50 | 0 | ND | ND | ND | 0.34 | ND | ND | 0.17 | 0.38 |
| | −50 | 0 | ND | ND | ND | ND | 0.19 | ND | ND | 0.37 |
| | 0 | 50 | ND | 1.12 | ND | 0.42 | ND | 0.21 | 0.16 | ND |
| | 0 | −50 | ND | ND | ND | 0.22 | ND | ND | ND | 0.65 |
| | Average | | 0 | 0.223 | 0.088 | 0.195 | 0.037 | 0.089 | 0.065 | 0.339 |
| Chemical Clean #2 | 0 | 0 | ND | ND | ND | ND | 0.14 | ND | 0.19 | ND |
| | 50 | 0 | ND | 0.76 | ND | ND | ND | ND | ND | ND |
| | −50 | 0 | ND | ND | ND | ND | ND | ND | ND | 0.43 |
| | 0 | 50 | ND | ND | 0.31 | ND | 0.23 | ND | ND | 0.51 |
| | 0 | −50 | ND | ND | ND | 0.3 | ND | ND | ND | ND |

TABLE 4-continued

| | Position | | Ti | Cr | Mn | Fe | Co | Ni | Cu | Zn |
|---|---|---|---|---|---|---|---|---|---|---|
| | x (mm) | y (mm) | E10A/cm2 | E10A/cm2 | E10A/cm2 | E10A/cm2 | E10A/cm2 | E10A/cm2 | E10A/cm2 | E10A/cm2 |
| | Average | | 0 | 0.153 | 0.061 | 0.059 | 0.076 | 0 | 0.039 | 0.187 |
| DIW Clean | 0 | 0 | ND | 2.54 | ND | ND | 0.43 | ND | ND | 0.47 |
| | 50 | 0 | ND | 3.18 | ND | ND | 0.42 | ND | ND | 0.89 |
| | −50 | 0 | ND | 2.35 | 0.51 | ND | 0.16 | ND | ND | 0.65 |
| | 0 | 50 | ND | 3.1 | ND | 0.23 | 0.23 | ND | ND | 0.45 |
| | 0 | −50 | ND | 2.43 | ND | ND | 0.37 | ND | ND | 0.51 |
| | Average | | 0 | 2.72 | 0.101 | 0.046 | 0.321 | 0 | 0 | 0.592 |
| Ini. | 0 | 0 | ND | ND | ND | ND | ND | ND | ND | 0.55 |
| | 50 | 0 | ND | ND | ND | ND | ND | ND | ND | 0.62 |
| | −50 | 0 | ND | ND | ND | ND | ND | ND | ND | 0.39 |
| | 0 | 50 | ND | ND | ND | ND | ND | ND | 0.18 | 0.69 |
| | 0 | −50 | ND | ND | ND | 0.23 | ND | ND | ND | 0.54 |
| | Average | | 0 | 0 | 0 | 0.046 | 0 | 0 | 0.037 | 0.556 |

What is claimed is:

1. A method of polishing a substrate surface having thereon a metal comprising tungsten and a dielectric material, comprising:

A) providing a substrate having a surface comprising tungsten and a dielectric material;

B) introducing a polishing composition to the surface of the substrate, said polishing composition having a pH between about 1.5 to about 3.5 and, based on the weight of the polishing composition, comprising water and about 0.05% to about 0.8% by weight of periodic acid;

C) movably applying a polishing pad over the polishing composition-covered substrate and thereby removing both tungsten and dielectric material, wherein the polishing pad exerts a pressure on the substrate, wherein the polishing composition comprises a silica abrasive, the pad comprises a silica abrasive, or both, and wherein at a 41000 Pa polishing pressure the tungsten polishing rate is between 1000 to 5000 Å/min and the tungsten/dielectric removal rate selectivity is between about 1:2 to about 2:1; and D) rinsing the polishing slurry from the substrate.

2. The method of claim 1 wherein the pad comprises a silica abrasive, and the polishing composition is substantially free of silica abrasive.

3. The method of claim 1 wherein the pad comprises a silica abrasive, and wherein the polishing composition comprises between about 0.1% to about 0.6% of periodic acid and further comprises about 0% to about 8% of colloidal a silica abrasive, based on the weight of the polishing composition.

4. The method of claim 1 wherein the pad comprises a silica abrasive, and wherein the polishing composition comprises between about 0.1% to about 0.6% of periodic acid and further comprises about 0.2% to about 5% of colloidal silica abrasive, based on the weight of the polishing composition, wherein the colloidal silica abrasive has an average size between about 20 to about 120 nanometers.

5. The method of claim 1 wherein the pad comprises a silica abrasive, and wherein the polishing composition comprises between about 0.25% to about 0.5% of periodic acid and further comprises colloidal silica abrasive, wherein the colloidal silica abrasive has an average size between about 20 to about 120 nanometers.

6. The method of claim 1 wherein the pad comprises a silica abrasive, and wherein the polishing composition consists essentially of water, between about 0.1% to about 0.6% of periodic acid, and optionally up to about 8% of colloidal silica abrasive.

7. The method of claim 1 wherein the pad comprises a silica abrasive, and wherein the polishing composition comprises between about 0.1% to about 0.6% of periodic acid and further comprises colloidal silica abrasive, wherein the colloidal silica abrasive has a cocoon shape and has an average size between about 30 to about 100 nanometers.

8. The method of claim 1 wherein the polishing composition comprises, based on the weight of the polishing composition, A) about 87.2% to 99.45% of water; B) about 0.05% to about 0.8% of periodic acid; and C) about 0.5% to about 12% of a colloidal silica abrasive having an average particle diameter between about 15 to about 120 nanometers.

9. The method of claim 1 wherein the polishing composition comprises, based on the weight of the polishing composition, A) about 91.4% to 98.9% of water; B) about 0.1% to about 0.6% of periodic acid; and C) about 1% to about 8% of a colloidal silica abrasive having an average particle diameter between about 25 to about 90 nanometers.

10. The method of claim 1 wherein the polishing composition consists essentially of, based on the weight of the polishing composition, A) about 91.4% to 98.9% of water; B) about 0.1% to about 0.6% of periodic acid; and C) about 1% to about 8% of a colloidal silica abrasive having an average particle diameter between about 25 to about 90 nanometers.

11. The method of claim 1 wherein the polishing composition comprises colloidal silica abrasive particles having a cocoon shape and an average size between about 30 to about 100 nanometers.

12. The method of claim 1 wherein the polishing composition has a pH of about 1.7 to about 3 and comprises colloidal silica abrasive particles having a cocoon shape and an average size between about 30 to about 100 nanometers.

13. The method of claim 1 wherein the dielectric material comprises at least one of PSG, TEOS, Thermal oxide, NSG, or HDP.

14. The method of claim 1 wherein the ratio of the removal rate of tungsten to the removal rate of the dielectric, at a top ring pressure of about 41000 Pa, is between 1.7:1 to 1:1.

15. The method of claim 1 wherein the step of movably applying a polishing pad over the polishing composition-covered substrate and thereby removing both tungsten and dielectric material comprises a first step wherein the pressure is between about 30000 and 70000 Pa, followed by a second step wherein the pressure is between about 5000 and 25000 Pa.

16. The method of claim 1 wherein the ratio of the removal rate of tungsten to the removal rate of the dielectric is between about 1.3:1 to about 1:1.3.

17. The method of claim 1 wherein the step of rinsing the polishing slurry from the substrate comprises contacting the polished substrate surface with a rinse composition comprising water, a peroxide, and ammonium or a mono-, di-, tri, or tetra alkyl ammonium compound having six or less carbon atoms.

18. The method of claim 1 wherein the step of rinsing the polishing slurry from the substrate comprises contacting the polished substrate surface with a rinse composition comprising water and an organophosphonate compound.

19. The method of claim 1 wherein the polishing composition further comprises about 0.1% to about 2% of a chelator.

20. The method of claim 1 wherein the polishing composition is substantially free of buffering salts, chelators, suspension agents, corrosion inhibitors, metal-based accelerators, non-metal-based accelerators, rheological agents, additional oxidizers, and additional abrasive material.

21. The method of claim 1 wherein the polishing composition further comprises a buffering compound from about 0.01% to about 1% and the abrasive is a cocoon-shaped colloidal silica abrasive having an average size of at least 30 nm.

22. A method of polishing a substrate surface having thereon a metal comprising tungsten and a dielectric material, comprising:
A) providing a substrate having a surface comprising tungsten and a dielectric material;
B) introducing a polishing slurry to the surface of the substrate, said polishing slurry having a pH between about 1.5 to about 3.5 and, based on the weight of the polishing composition, comprising water, about 0.05% to about 0.8% by weight of periodic acid, and about 0.5% to about 12% of a colloidal silica abrasive having a weight-average mean particle diameter between about 15 to about 120 nanometers;
C) movably applying a polishing pad over the polishing composition-covered substrate and thereby removing both tungsten and dielectric material, wherein the polishing pad exerts a pressure on the substrate, and wherein the tungsten/dielectric removal rate selectivity is between about 1:2 to about 2:1; and
D) rinsing the polishing slurry from the substrate.

23. The method of claim 22 wherein the polishing slurry consists essentially of water, about 0.05% to about 0.8% by weight of periodic acid, and about 0.5% to about 12% of a colloidal silica abrasive having a weight-average mean particle diameter between about 15 to about 120 nanometers.

24. The method of claim 22 wherein the ratio of the removal rate of tungsten to the removal rate of the dielectric is between about 1.3:1 to about 1:1.3.

25. The method of claim 22 wherein the step of rinsing the polishing slurry from the substrate comprises contacting the polished substrate surface with a rinse composition comprising water, a peroxide, and ammonium or a mono-, di-, tri, or tetra alkyl ammonium compound having six or less carbon atoms.

26. The method of claim 22 wherein the step of rinsing the polishing slurry from the substrate comprises contacting the polished substrate surface with a rinse composition comprising water and an organophosphonate compound.

27. The method of claim 22, wherein the removal rate ratio of tungsten to dielectric material is from about 1:1.15 to about 1.15:1.

28. The method of claim 22, wherein the removal rate ratio of tungsten to dielectric material is from about 1:1.05 to about 1.05:1.

29. A method of polishing a substrate surface having thereon a metal comprising tungsten and a dielectric material, comprising:
A) providing a substrate having a surface comprising tungsten and a dielectric material;
B) introducing a polishing slurry to the surface of the substrate, said polishing slurry having a pH between about 1.5 to about 3.5 and, based on the weight of the polishing composition, comprising about 0.05% to about 0.8% by weight of periodic acid, and about 0.5% to about 12% of a colloidal silica abrasive having a weight-average mean particle diameter between about 50 to about 90 nanometers;
C) movably applying a polishing pad over the polishing composition-covered substrate and thereby removing both tungsten and dielectric material, wherein the polishing pad exerts a pressure on the substrate, and wherein the tungsten removal rate is between 300 to 6000 Angstroms per minute and the tungsten/dielectric removal rate selectivity is between about 1:1.7 to about 1.7:1; and
D) rinsing the polishing slurry from the substrate.

* * * * *

UNITED STATES PATENT AND TRADEMARK OFFICE
CERTIFICATE OF CORRECTION

| | |
|---|---|
| PATENT NO. | : 7,316,976 B2 |
| APPLICATION NO. | : 11/132315 |
| DATED | : January 8, 2008 |
| INVENTOR(S) | : Nojo et al. |

It is certified that error appears in the above-identified patent and that said Letters Patent is hereby corrected as shown below:

In column 18, line 43, correct claim 29 to read:

--wherein at a 41000 Pa polishing pressure the tungsten removal rate is between 300 to--

Signed and Sealed this

Seventeenth Day of June, 2008

JON W. DUDAS
*Director of the United States Patent and Trademark Office*